(12) United States Patent
Liu

(10) Patent No.: US 10,541,162 B2
(45) Date of Patent: Jan. 21, 2020

(54) SYSTEMS AND METHODS FOR WAFER POD CALIBRATION

(71) Applicant: Taiwan Semiconductor Manufacturing Co., Ltd., Hsin-Chu (TW)

(72) Inventor: Chao-Hsiang Liu, Hsin-Chu (TW)

(73) Assignee: Taiwan Semiconductor Manfacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/882,272

(22) Filed: Jan. 29, 2018

(65) Prior Publication Data

US 2019/0164790 A1  May 30, 2019

Related U.S. Application Data

(60) Provisional application No. 62/591,405, filed on Nov. 28, 2017.

(51) Int. Cl.
| | |
|---|---|
| G06F 7/00 | (2006.01) |
| H01L 21/67 | (2006.01) |
| G01B 11/00 | (2006.01) |
| B25J 9/16 | (2006.01) |
| B25J 11/00 | (2006.01) |
| H01L 21/687 | (2006.01) |
| H01L 21/68 | (2006.01) |
| H01L 21/673 | (2006.01) |
| H01L 21/677 | (2006.01) |

(52) U.S. Cl.
CPC ...... *H01L 21/67265* (2013.01); *B25J 9/1669* (2013.01); *B25J 9/1694* (2013.01); *B25J 11/0095* (2013.01); *G01B 11/002* (2013.01); *H01L 21/67259* (2013.01); *H01L 21/67386* (2013.01); *H01L 21/67778* (2013.01); *H01L 21/68* (2013.01); *H01L 21/68707* (2013.01); *Y10S 901/09* (2013.01); *Y10S 901/47* (2013.01)

(58) Field of Classification Search
None
See application file for complete search history.

(56) References Cited

U.S. PATENT DOCUMENTS

| | | | | |
|---|---|---|---|---|
| 9,026,244 B1* | 5/2015 | Mazzocco | ............ | G05B 19/401 700/229 |
| 9,405,287 B1* | 8/2016 | Ravid | .................. | G05B 19/402 |
| 2003/0129047 A1* | 7/2003 | Teng | ................. | H01L 21/67265 414/416.01 |

(Continued)

FOREIGN PATENT DOCUMENTS

TW     201724334 A     7/2017

OTHER PUBLICATIONS

Official Action dated Jan. 19, 2019, in corresponding Taiwan Patent Application No. 10820046590.

*Primary Examiner* — Yolanda R Cumbess
(74) *Attorney, Agent, or Firm* — Duane Morris LLP

(57) ABSTRACT

In an embodiment, a system includes: a wafer pod defining a cavity configured to store a wafer at a wafer position; calibration sensors within the cavity, each calibration sensor configured to produce calibration data indicating that the wafer is at a respective part of the cavity; and a processor configured to determine whether the wafer is positioned at the wafer position within the cavity based on the calibration data.

14 Claims, 11 Drawing Sheets

(56) References Cited

U.S. PATENT DOCUMENTS

2007/0252966 A1* 11/2007 Shirata ................ G03F 7/70525
          355/67
2011/0076847 A1*  3/2011 Aqui ................... C23C 14/5813
          438/674
2016/0240420 A1*  8/2016 Wagenleitner .... H01L 21/67092

* cited by examiner

SYSTEMS AND METHODS FOR WAFER POD CALIBRATION

CROSS-REFERENCE TO RELATED APPLICATION

The present application claims priority to U.S. Provisional Patent Application No. 62/591,405, filed on Nov. 28, 2017, which is incorporated by reference herein in its entirety.

BACKGROUND

Modern assembly line manufacturing processes are typically highly automated to manipulate materials and devices and create a finished product. Quality control and maintenance processes often rely on human skill, knowledge and expertise for inspection of the manufactured product and manufacturing process.

Typical assembly line processes for processing wafers (e.g., semiconductor devices or materials) employ no specific inspection techniques at a robotic arm for calibration with a wafer carrying pod, also termed as a wafer pod, aside from manual inspections. Examples of wafer pods include standard mechanical interface (SMIF) pods which may hold a plurality of wafers, or front opening unified pods (FOUPs) which may hold larger wafers. Calibration may refer to a wafer being properly placed within a wafer pod at a wafer position. As an example, a wafer position may be a centered position that is away from any of the side, rear, or front walls (e.g., doors) of a wafer pod.

Calibration may be important as a robotic arm that is not calibrated with a wafer pod may place or retrieve wafers from the wafer pod in a manner that damages the wafer. For example, a non-calibrated robotic arm may damage a wafer by impacting the wafer carried by the non-aligned robotic arm against a side, front, or rear wall of the wafer pod. Conventional manual inspection and calibration techniques require large amounts of overhead and expensive hardware, but still fail to produce satisfactory results. Therefore, conventional inspection and calibration techniques are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
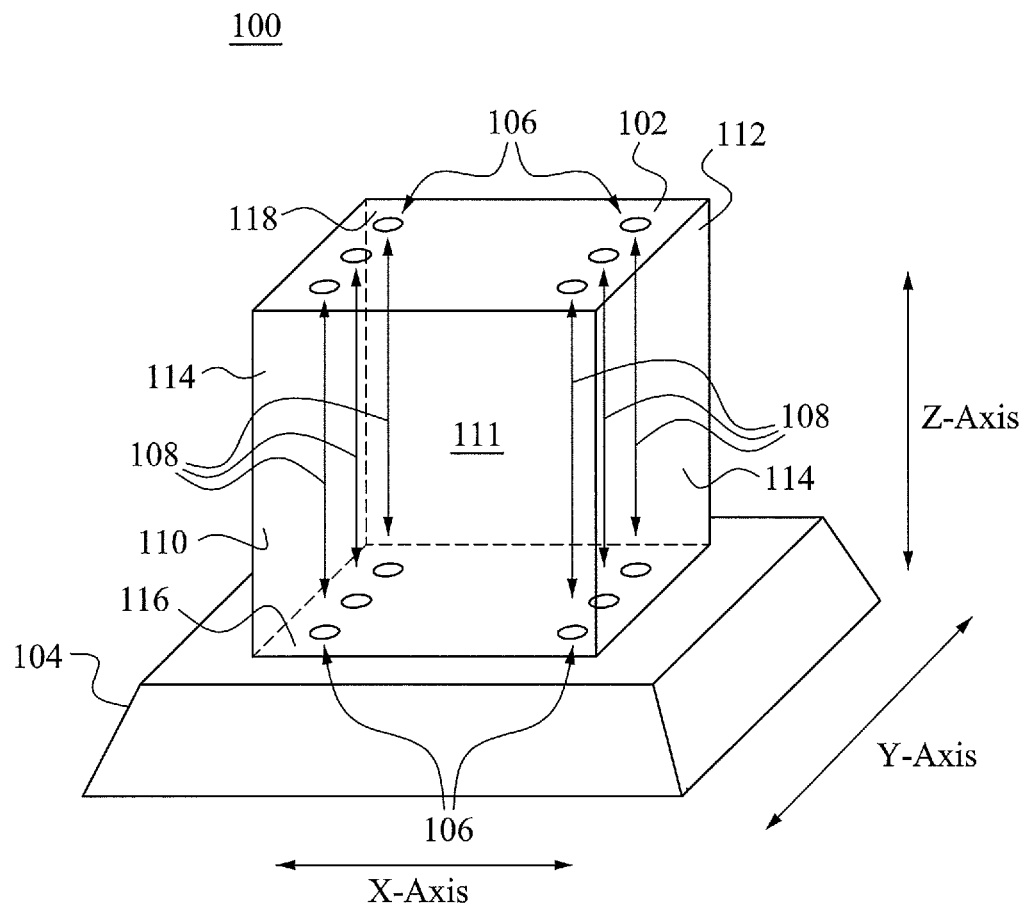
FIG. 1 is a perspective partial transparency diagram of a calibration wafer pod, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of automated calibration of a wafer to a wafer position within a calibration wafer pod. The wafer may be secured and moved by a robotic arm. Also, the calibration wafer pod may be a wafer pod modified as discussed further below. The wafer position may be a set or predetermined position for a wafer within a cavity of a calibration wafer pod that is configured to receive and store a wafer. The wafer position may be a location within the cavity with sufficient clearance so that the wafer will not easily impact with a side wall, rear wall, or front wall of the calibration wafer pod. Also, the wafer position may facilitate easy movement by the robotic arm (e.g., movements to deposit and/or pick up a wafer from the wafer position).

A number of calibration sensors may be arrayed within the calibration wafer pod. The calibration sensors may be proximity sensors which sense whether a wafer is within a particular location of the calibration wafer pod. For example, the calibration sensors may be arrayed in a mesh or a grid pattern such that various critical areas (e.g., monitored regions) of a calibration wafer pod cavity may be assessed for the wafer's presence. These calibration sensors may produce calibration data indicating whether a wafer is present within a monitored region monitored by a particular calibration sensor. The calibration data may be analyzed to produce error data that indicates that a wafer is not at the wafer position. The error data may also indicate how a wafer should be moved to better calibrate to the wafer position.

FIG. 1 is a perspective partial transparency diagram 100 of a calibration wafer pod 102, in accordance with some embodiments. The calibration wafer pod 102 may be configured to be loaded and/or unloaded with at least one wafer while resting on a load port 104. Also, the calibration wafer pod may include calibration sensors 106 which may determine whether a wafer is within a monitored region 108 of the calibration wafer pod 102.

The calibration wafer pod 102 may include a door at a front wall 110 that provides a portal for ingress and/or egress of objects within a cavity 111 of the calibration wafer pod 102. The front wall 110 may be defined (e.g., generally extend) along the X axis and Z axis and be separated from a rear wall 112 by a Y axis. Also, side walls 114 may be defined along the X and Y axis. The calibration sensors 106 may be arrayed as parts of two lines, displaced from each other along the X axis and extending along the Y axis. Stated another way, the calibration sensors may be arrayed proximate to the side walls 114.

Calibration sensors 106 may include an emitter portion and a detection portion. The emitter portion may emit collimated radiation (e.g., light) that may be detected by the detection portion. In certain embodiments, the collimated radiation may be a laser light emitted by a laser and the detection portion may include a laser detector for the specific laser light emitted by an associated emitter portion. Stated another way, the emitter portion may include a photoelectric emitter that emits collimated radiation as a line or beam. Also, the detection portion may include a photoelectric sensor configured to detect particular types of the collimated radiation produced by the emitter portion. Accordingly, the calibration sensor may be a proximity sensor that senses the presence of an object, such as a wafer, within the monitored region (e.g., volume occupied by the collimated radiation) based on whether or not collimated radiation associated with a particular radiation detection portion is detected. For example, detection of the collimated radiation may indicate the absence of an object, such as the wafer. In contrast, non-detection of the associated collimated radiation may indicate the presence of an object, such as the wafer blocking the associated collimated radiation. The emitter portion and/or the radiation detection portion may be arrayed along either a floor 116 or a ceiling 118 of the calibration wafer pod 102. For example, if the emitter portion is on the floor 116, then the detection portion may be on the ceiling 118. Inversely, if the detection portion is on the floor 116, then the emitter portion may be on the ceiling 118.

In various embodiments, a calibration wafer pod may include multiple cavities for multiple wafers. The multiple cavities may be arrayed (e.g., displaced) along the vertical axis, such as where additional cavities may be reproduced above and/or below the cavity 111 (e.g., above the ceiling 118, where the ceiling 118 acts as a floor for another cavity of a multiple cavity wafer pod.

In particular embodiments, a calibration wafer pod may include through holes across each of the multiple cavities such that only a top cavity and a bottom cavity have calibration sensor components (e.g., emitter portion or detection portion). The top cavity may be the cavity above whose ceiling there are no more cavities or, in other embodiments, a topmost cavity for a calibration sensor component.

Also, the bottom cavity may be the cavity below whose floor there are no more cavities or, in other embodiments, a bottommost cavity for a calibration sensor component. These through holes may be aligned to allow for collimated radiation (e.g., laser light) to pass through respective through holes across different cavities. Accordingly, through holes may allow collimated radiation to pass through multiple cavities and thus provide calibration across each of the cavities. When wafers are loaded one at a time, the calibration data currently produced by the calibration sensors may be associated with the particular wafer also currently under transport by a robotic arm, and adjusted according to the currently produced calibration data. In particular embodiments, a calibration wafer pod may include through holes in the floor of the bottom cavity to allow collimated radiation from a load port to pass through multiple cavities and be sensed by a detection portion of a calibration sensor at the top cavity. In such embodiments, the source of collimated radiation at the load port maybe considered to be the emitter portion of the calibration sensor.

Figure 2A:
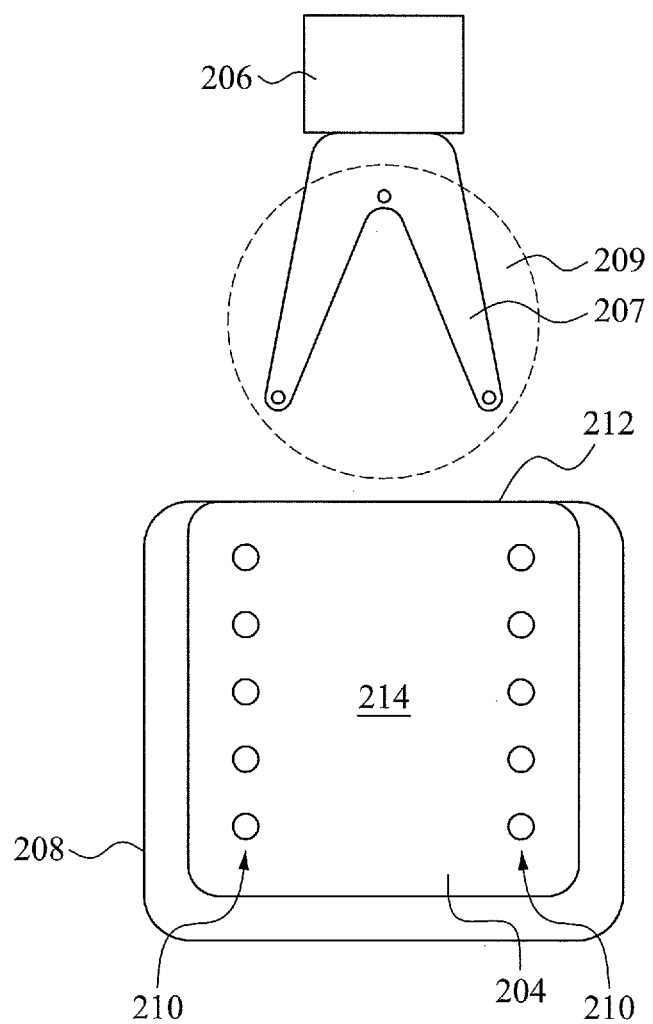
FIG. 2A is a top cross sectional view of a calibration wafer pod with a robotic arm, in accordance with some embodiments.

FIG. 2A is a top cross sectional view 200 of a calibration wafer pod 204 with a robotic arm 206, in accordance with some embodiments. The robotic arm 206 may have a gripper hand 207 that supports (e.g., secures) a wafer 209 to the robotic arm 206, such that the robotic arm may move or manipulate the wafer 209. Reference to the combination of a robotic atm 206 and the gripper hand 205 may be referred to as a robotic arm gripper hand. The calibration wafer pod 204 may rest on a load port 208 in preparation for transfer of wafers to and/or from the calibration wafer pod 204. The calibration wafer pod may include a number of calibration sensors 210 that generate calibration data characterizing the presence or absence of a wafer within a monitored region of a respective calibration sensor 210. The robotic arm 206 may move the wafer 209 into the calibration wafer pod through a door on a front wall 212 that is a portal into the cavity 214, within which the wafer may be received at a wafer position.

Figure 2B:
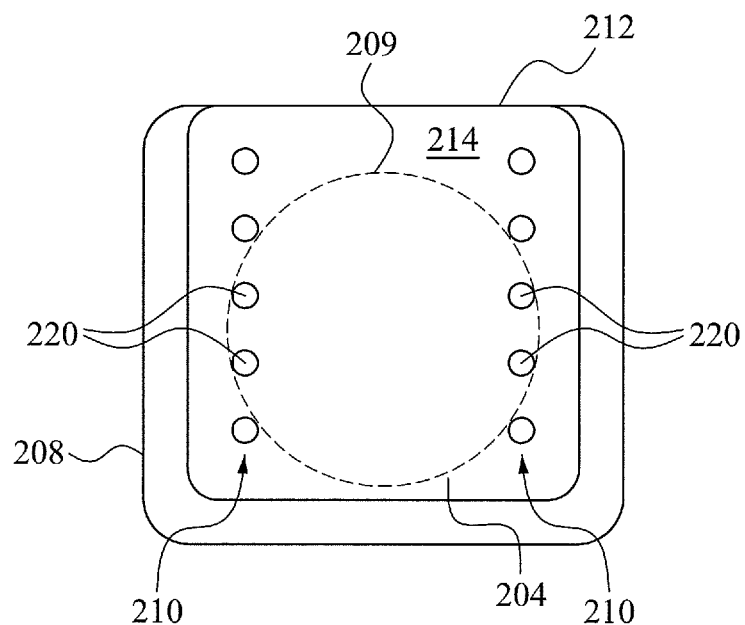
FIG. 2B is a top cross sectional view of a wafer resting in a wafer position, in accordance with some embodiments.

FIG. 2B is a top cross sectional view of the wafer 209 resting in the wafer position, in accordance with some embodiments. The wafer 209, when at the wafer position, may be present within a monitored region of four calibration sensors 220 but not within the monitored region of the other calibration sensors 210. Stated another way, the calibration sensors 210 may produce calibration data that indicates the presence or absence of an object within their respective monitored regions. A particular pattern of calibration data may be taken to be indicative of whether a wafer is at a wafer position. Accordingly, production of a pattern of calibration data that indicates that the wafer is at the wafer position may be determined as a temporal characterization of when the wafer is at the wafer position. Calibration data that indicates that a wafer is at the wafer position may be termed as wafer position calibration data. Also, different patterns of calibration data may be utilized to determine the manner in which a wafer is not within, or at, a wafer position. These different patterns of calibration data may also indicate possible remediation actions that may be taken to move the wafer into a wafer position. Calibration data that indicates that a wafer is not at the wafer position may be termed as error data. Error data may also indicate how a wafer may be moved to reach the wafer position.

Figure 3A:
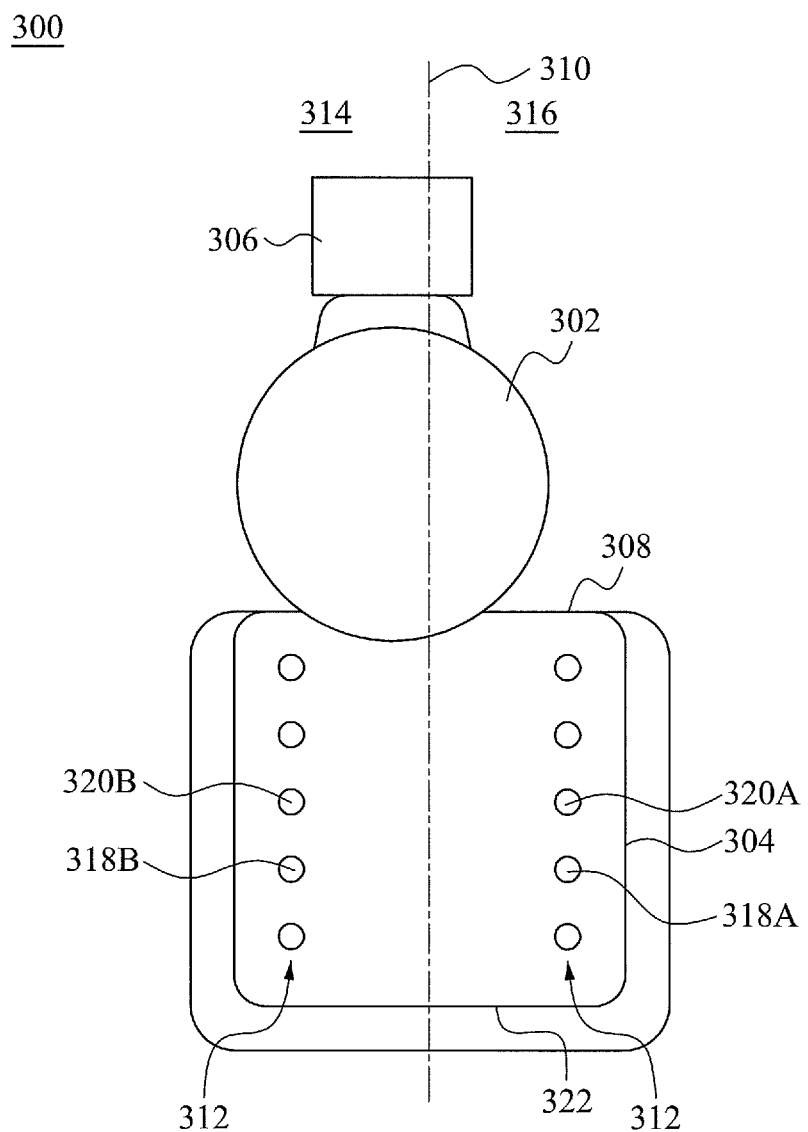
FIG. 3A is a top cross sectional view of a wafer as it enters a calibration wafer pod, in accordance with some embodiments.

FIG. 3A is a top cross sectional view 300 of a wafer 302 as it enters a calibration wafer pod 304, in accordance with some embodiments. The wafer 302 may be secured to a robotic arm 306 and moved as the robotic arm 306 moves. Also, the wafer 302 may enter through an open door along a front wall 308 of the calibration wafer pod 304. For ease of discussion, the calibration wafer pod 304 may be bisected evenly along an axis of entry 310, such that the arrangement of calibration sensors 312 are mirrored on either side (e.g., a left or right side) of the calibration sensors 312. As illustrated, the wafer 302 may be slightly offset such that a greater portion of the wafer 302 is on the left side 314 of the axis of entry 310 than on the right side 316 of the axis of entry. Also, the calibration sensors may not be linearly aligned (e.g., aligned to form a straight line) such that the second 318A, 318B and third 320A, 320B closest calibration sensors to the rear wall 322 are not linearly aligned with other calibration sensors 312. Stated another way, the second 318A, 318B and third 320A, 320B closest calibration sensors to the rear wall 322 are linearly offset from other calibration sensors 312. In total, there may be an equal number of five calibration sensors 312 on either side of the axis of entry 310.

Figure 3B:
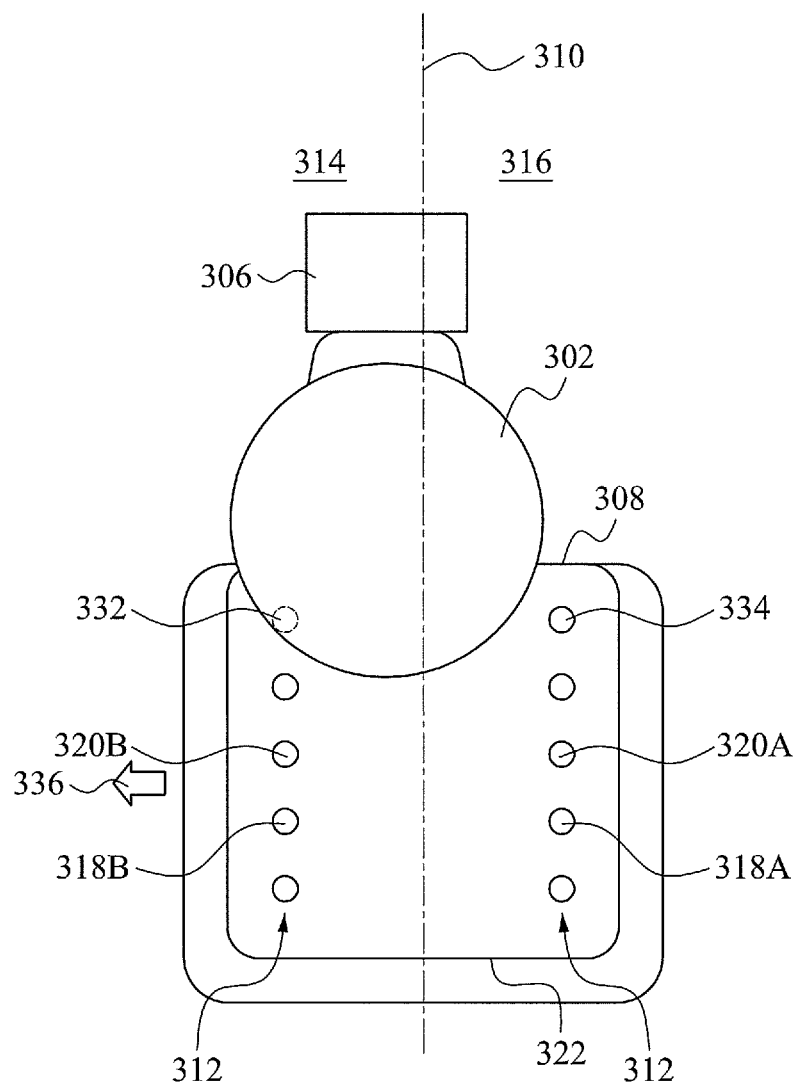
FIG. 3B is a top cross sectional view of a robotic arm that is left offset, in accordance with some embodiments.

FIG. 3B is a top cross sectional view 330 of the robotic arm 306 that is left offset, as indicated by calibration data from a left fifth closest calibration sensor 332 to the rear wall 322 on the left side 314 of the axis of entry 315, in accordance with some embodiments. Specifically, a pattern of calibration data from the calibration sensors 312 that indicates the presence of the wafer at the left fifth closest calibration sensor 332 but not a right fifth closest calibration sensor 334 may indicate that the wafer 302 is left 314 offset as it enters the calibration wafer pod. This pattern of calibration data may also indicate that remediation may be performed by moving the robotic arm 306 to the right 316 of the axis of entry 315. This left 314 offset may be indicated by leftward facing arrow 336.

Figure 3C:
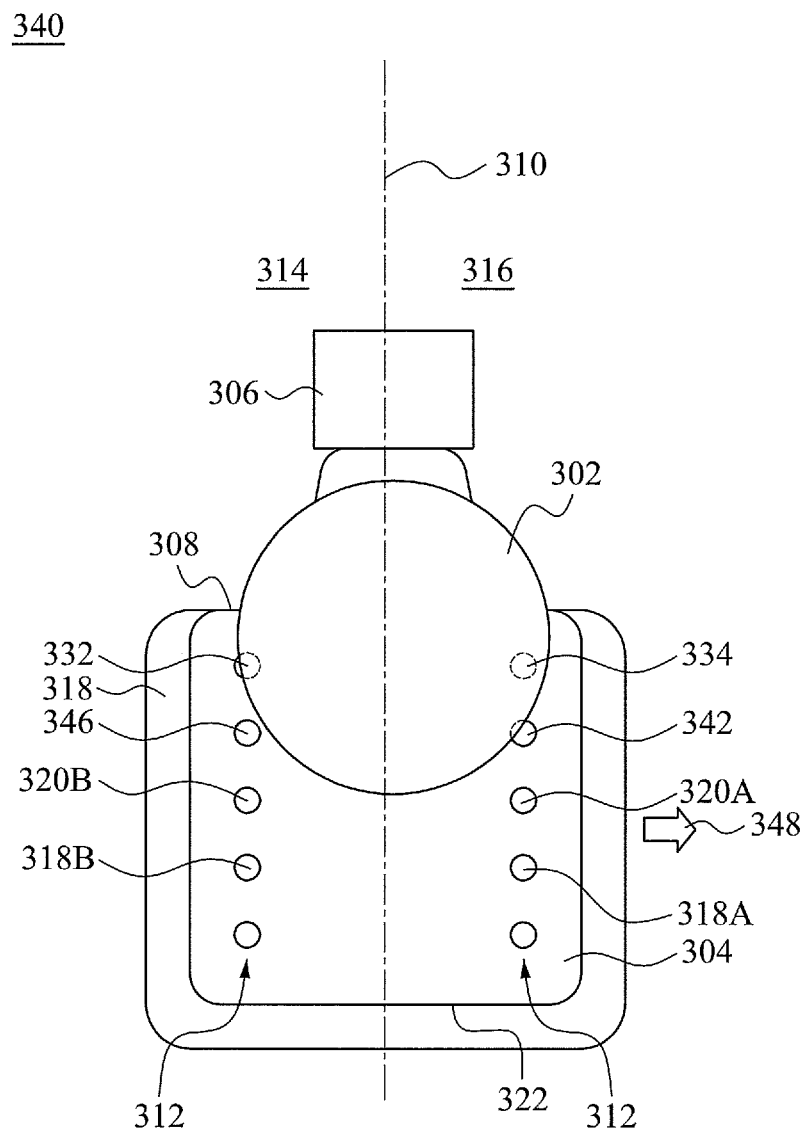
FIG. 3C is a top cross sectional view of a robotic arm that is right offset, in accordance with some embodiments.

FIG. 3C is a top cross sectional view 340 of the robotic arm 306 that is right offset, as indicated by calibration data from a right fourth closest calibration sensor 342 to the rear wall 322 on the right side 316 of the axis of entry 315, in accordance with some embodiments. A pattern of calibration data from the calibration sensors 312 that indicates the presence of the wafer 302 at the right fourth 342, the right fifth 334, left fifth 332 but not the left fourth 346 closest calibration sensors to the rear wall 322 may indicate that the wafer 302 is right 316 offset as it enters the calibration wafer pod 304. This pattern of calibration data may also indicate that remediation may be performed by moving the robotic arm 306 to the left 314 of the axis of entry 315 during entry to the calibration wafer pod 304. This right 316 offset may be indicated by leftward facing arrow 348.

Figure 3D:
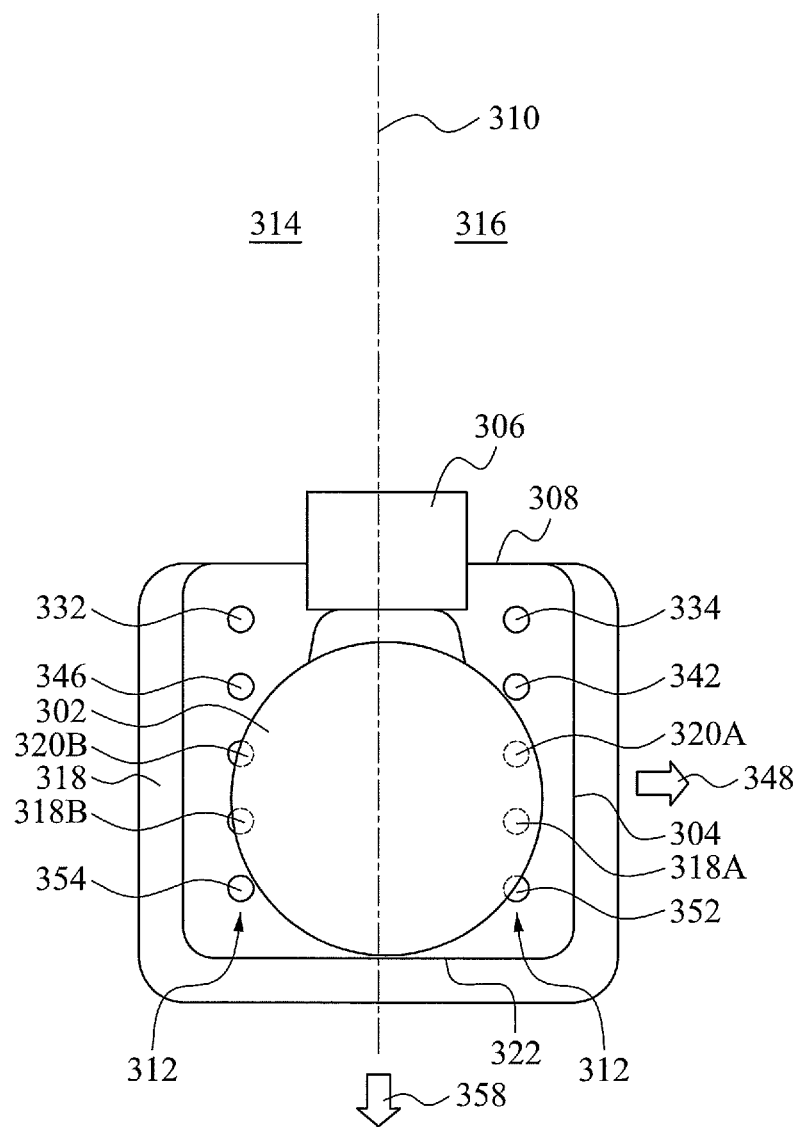
FIG. 3D is a top cross sectional view of a robotic arm that is right offset and rear offset, in accordance with some embodiments.

FIG. 3D is a top cross sectional view 350 of the robotic arm 306 that is right offset, as indicated by calibration data from a right first closest calibration sensor 352 to the rear wall 322, in accordance with some embodiments. A pattern of calibration data from the calibration sensors 312 that indicates the presence of the wafer at the right second 318A, left second 318B, right third 320A, left third 320B and the right first 352 but not the left first 354 closest calibration sensor to the rear wall 322 may indicate that the wafer 302 is right 316 and rear offset as it enters the calibration wafer pod 304. This pattern of calibration data may also indicate that remediation may be performed by moving the robotic arm 306 to the left 314 of the axis of entry 310 and back toward the front wall 308. This right 316 offset may be indicated by leftward facing arrow 348 and the rear facing arrow 358.

Figure 3E:
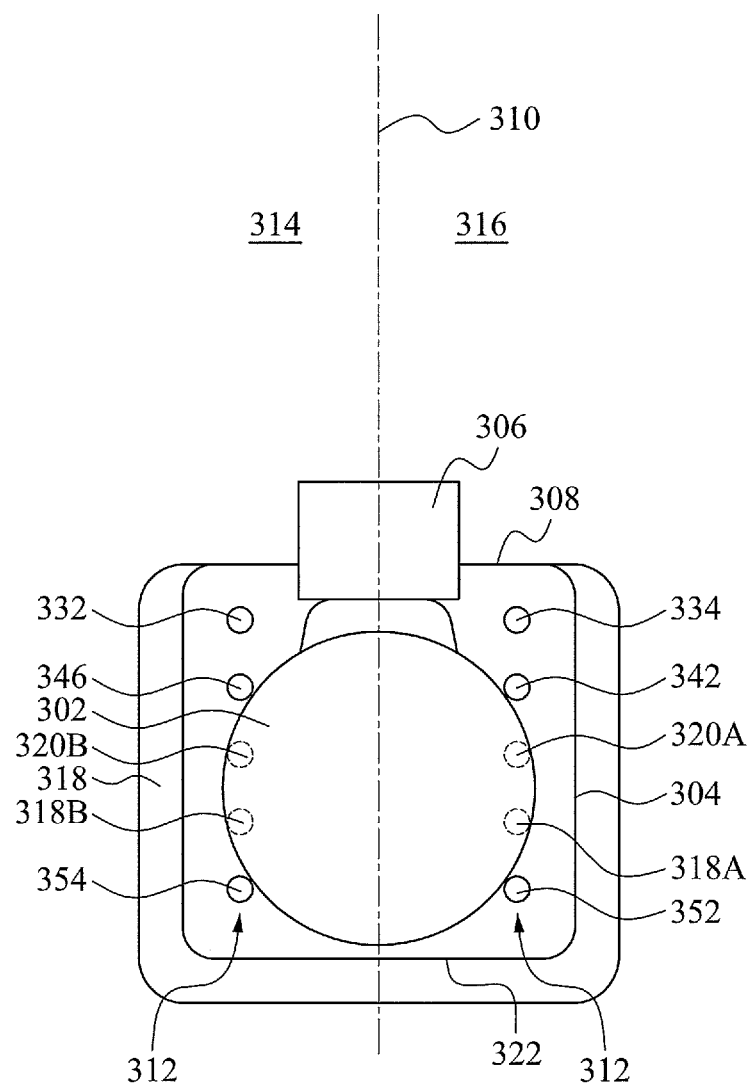
FIG. 3E is a top cross sectional view of a robotic arm placing a wafer at a wafer position, in accordance with some embodiments.

FIG. 3E is a top cross sectional view 360 of the robotic arm 306 placing the wafer 302 at the wafer position, in accordance with some embodiments. A pattern of calibration data from the calibration sensors 312 that indicates the presence of the wafer at the right second 318A, left second 318B, right third 320A, and left third 320B closest calibration sensors to the rear wall 322 may indicate that the wafer 302 is at the wafer position. In certain embodiments, this indication that the wafer 302 is in the wafer position may have referenced with historical calibration data that indicates that the wafer 302 was previously in the monitored region of the right fourth 342, the right fifth 334, left fifth 332, and the left fourth 346 closest calibration sensors. Also, in particular embodiments, the robotic arm may halt or stop movement when the pattern of calibration data indicates that the wafer is at the wafer position.

Figure 3F:
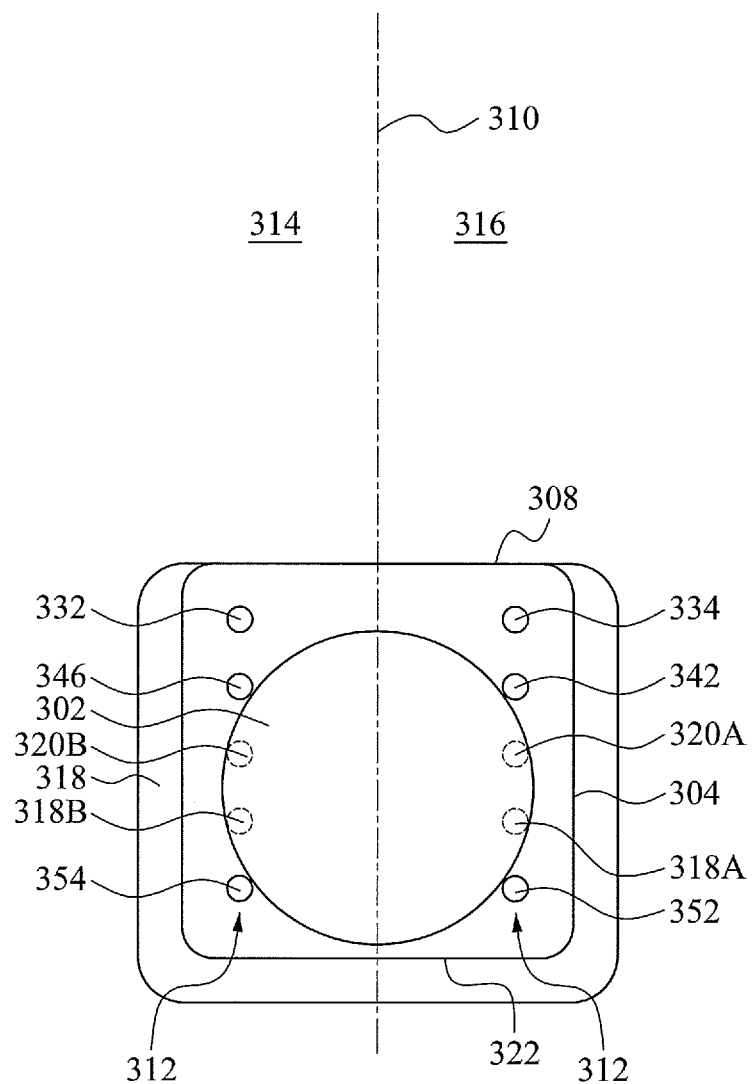
FIG. 3F is a top cross sectional view of a wafer placed at the at a wafer position, in accordance with some embodiments.

FIG. 3F is a top cross sectional view 370 of the wafer 302 placed at the at the wafer position, in accordance with some embodiments. The wafer 302 may be placed at the wafer position and not be supported by the robotic arm, as indicated by the absence of the robotic arm in this top cross sectional view 370.

Figure 4:
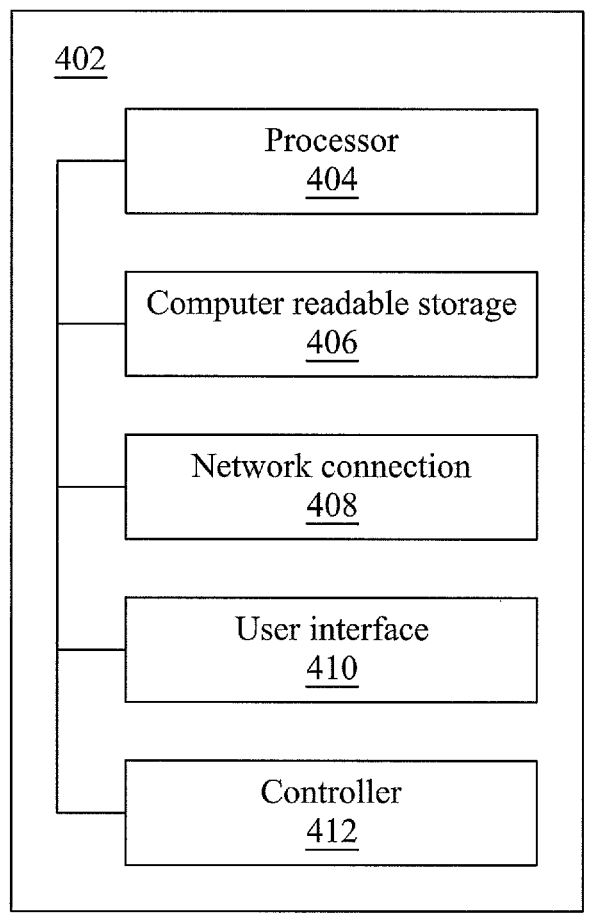
FIG. 4 is a block diagram of various functional modules of a wafer pod calibration functional module, in accordance with some embodiment.

FIG. 4 is a block diagram of various functional modules of a wafer pod calibration functional module, in accordance with some embodiment. The wafer pod calibration functional module 402 may be part of a wafer pod calibration system that includes at least the robotic arm and the calibration wafer pod discussed above. The wafer pod calibration functional module 402 may include a processor 404. In further embodiments, the processor 404 may be implemented as one or more processors.

The processor 404 may be operatively connected to a computer readable storage module 406 (e.g., a memory and/or data store), a network connection module 408, a user interface module 410, a controller module 412, and a sensor module 414. In some embodiments, the computer readable storage module 406 may include wafer pod calibration process logic that may configure the processor 404 to perform the various processes discussed herein. The computer readable storage may also store data, such as calibration sensor data collected by calibration sensors, identifiers for a robotic arm, identifiers for a gripper hand, identifiers for a calibration sensor, calibration data patterns, and any other parameter or information that may be utilized to perform the various processes discussed herein.

The network connection module 408 may facilitate a network connection of the wafer pod calibration system with various devices and/or components of the wafer pod calibration system that may communicate (e.g., send signals, messages, instructions, or data) within or external to the wafer pod calibration functional module 402. In certain embodiments, the network connection module 408 may facilitate a physical connection, such as a line or a bus. In other embodiments, the network connection module 408 may facilitate a wireless connection, such as over a wireless local area network (WLAN) by using a transmitter, receiver, and/or transceiver. For example, the network connection module 408 may facilitate a wireless or wired connection with a calibration sensor, the processor 404 and the controller module 412.

The wafer pod calibration functional module 402 may also include the user interface module 410. The user interface may include any type of interface for input and/or output to an operator of the wafer pod calibration system, including, but not limited to, a monitor, a laptop computer, a tablet, or a mobile device, etc.

The wafer pod calibration functional module 402 may include a controller module 412. The controller module 412 may be configured to control various physical apparatuses that control movement or functionality of the robotic arm and/or the calibration wafer pod. For example, the controller module 412 may be configured to control movement or functionality for at least one of a robotic arm, a gripper hand, a calibration sensor, and/or a wafer pod door. For example, the controller module 412 may control a motor that may move at least one of a gripper hand, a robotic arm, and/or a door of a wafer pod. The controller may be controlled by the processor and may carry out the various aspects of the various processes discussed herein.

Figure 5:
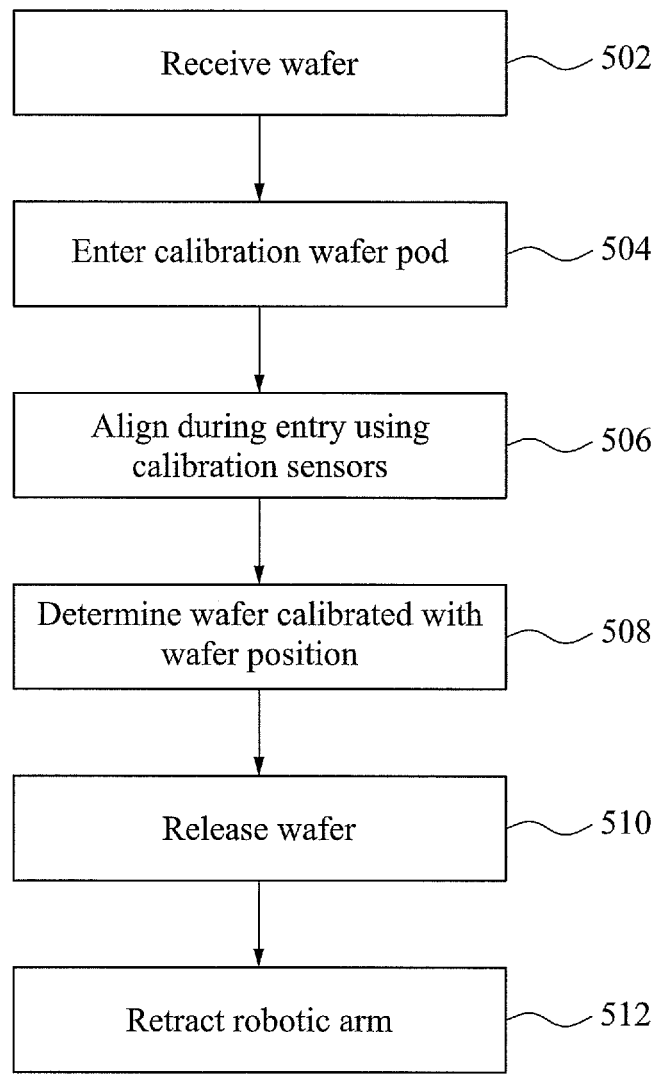
FIG. 5 is a flow chart of a wafer pod calibration process, in accordance with some embodiments.

FIG. 5 is a flow chart of a wafer pod calibration process 500, in accordance with some embodiments. The wafer pod calibration process may be performed by a wafer pod calibration system, as discussed above. It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein.

At operation 502, a robotic arm gripper hand (e.g., gripper hand of a robotic arm) of the wafer pod calibration system may receive a wafer. In being received, the wafer may be secured to the robotic arm gripper hand and thus moved by the wafer pod calibrations system. In certain embodiments, the wafer is secured or received by the robotic atm gripper hand gripping onto the wafer along at least two surfaces of the wafer (e.g., top and bottom surfaces). In other embodiments, the wafer is secured or received by the robotic arm gripper hand supporting the weight of the wafer (e.g., being below the wafer, such that the wafer rests on the robotic arm gripper hand).

At operation 504, the robotic arm gripper hand may move the wafer into a calibration wafer pod. Entry into the calibration wafer pod may include the calibration wafer pod opening a door to a cavity of the calibration wafer pod that is configured to receive a wafer. After opening the door, the robotic arm gripper hand may begin to move the wafer into the calibration wafer pod.

At operation 506, the wafer pod calibration system may generate calibration data concerning the wafer as the wafer enters the calibration wafer pod. This calibration data may be utilized to align or calibrate the wafer to eventually move to a wafer position. The calibration data may be produced by various calibration sensors within the calibration wafer pod. The calibration data may characterize (e.g., detect) the presence of the wafer in various monitored regions associated with the calibration sensors. As noted above, the calibration sensors may be proximity sensors that may determine the presence or absence of the wafer (or an object) within the monitored region of the calibration sensor. The calibration sensors may produce calibration data in a pattern that characterizes whether the entry of the wafer into the calibration wafer pod is offset, such as being right or left offset relative to an axis of entry, as discussed above.

In various embodiments, the robotic arm gripper hand may be controlled to remediate for any offsets indicated in the calibration data. For example, if the calibration data indicates that the wafer is left offset, the robotic arm may be controlled to move toward the right to remediate the left offset. As discussed above, an offset may be detected when more calibration sensors detect the wafer on one side of an axis of entry than another side of the axis of entry. Also, an offset may be detected when certain calibration sensors detect the wafer in a place other than the wafer region. Stated another way, the arrangement of calibration sensors on both sides of the axis of entry may mirror each other, such that any difference in detection on different sides of the axis of entry may be indicative of an offset. In certain embodiments, this remediation may occur in real time as the robotic arm gripper hand moves the wafer into the calibration wafer pod (e.g., operations 506 and 504 may be concurrent).

At operation 508, the wafer pod alignment system may determine whether the calibration data indicates that the wafer is calibrated with a wafer position (e.g., whether the wafer is at the wafer position). As noted above, the wafer may be determined as calibrated with a wafer position when only certain calibration sensors detect the wafer in a pattern that is indicative of a wafer at the wafer position. Also, in certain embodiments, the wafer may be determined as calibrated with a wafer position based on a change in patterns of calibration data over time. For example, a wafer may be determined to be at a wafer position after past calibration data indicated entry of the wafer into the calibration wafer pod, and when current calibration data indicates that the wafer is at the wafer position.

At operation 510, the wafer pod alignment system may have the robotic arm gripper hand release the wafer into the calibration wafer pod at the wafer position. This may include, for example, the robotic arm gripper hand releasing the wafer and/or the calibration wafer pod extending rods to slightly lift a wafer from the robotic arm gripper hand.

At operation 512, the wafer pod alignment system may retract the robotic arm gripper hand out of the calibration wafer pod without the wafer. The robotic arm gripper hand may be retracted so that the wafer is deposited and secured in the calibration wafer pod, independent of the robotic arm gripper hand. In certain embodiments where the calibration wafer pod may extend rods to slightly lift a wafer from a robotic arm gripper hand, the rods may retract into the calibration wafer pod after the wafer hand is retracted. Then, the wafer may rest directly on a floor of the calibration wafer pod.

In an embodiment, a system includes: a wafer pod defining a cavity configured to store a wafer at a wafer position; calibration sensors within the cavity, each calibration sensor configured to produce calibration data indicating that the wafer is at a respective part of the cavity; and a processor configured to determine whether the wafer is positioned at the wafer position within the cavity based on the calibration data.

In another embodiment, a system includes: a wafer pod configured to receive a wafer; calibration sensors within the wafer pod, each calibration sensor configured to produce calibration data indicating the wafer within a respective part of the wafer pod; and a processor configured to produce error data indicating how the wafer is offset from a wafer position within the wafer pod based on the calibration data; and a robotic arm configured to move the wafer based on the error data.

In another embodiment, a method includes: collecting calibration data characterizing a wafer within a part of a wafer pod defining a cavity; producing error data indicating how the wafer is offset from a wafer position within the cavity; and moving the wafer based on the error data.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
   a first wafer pod defining a first cavity configured to store a first wafer at a first predetermined wafer position;
   a second wafer pod defining a second cavity configured to store a second wafer at a second predetermined wafer position, wherein the second wafer pod is stacked vertically above the first wafer pod;
   a plurality of light emitters disposed on a top surface of the second wafer pod, wherein a first plurality of the light emitters is arranged in a first line on a first side of an axis of entry of the second wafer pod that horizontally bisects the second cavity and a second plurality of the light emitters is arranged in a second line on a second side of the axis of entry of the second wafer pod;
   a plurality of light detectors disposed on a bottom surface of the first wafer pod, wherein a first plurality of the light emitters is arranged in a first line on a first side of an axis of entry of the first wafer pod that horizontally bisects the first cavity and a second plurality of the light detectors is arranged in a second line on a second side of the axis of entry of the first wafer pod, wherein the plurality of light detectors are configured to produce calibration indicating whether the first and second wafers are positioned at their first and second wafer positions, respectively;
   a plurality of through holes disposed on a top surface of the first wafer pod and a bottom surface of the second wafer pod, wherein a first plurality of the through holes is arranged in the first line on the first side of the axis of entries of the first wafer pod and the second wafer pod, respectively, and a second plurality of the through holes is arranged in the second line on the second side of the axis of entries of the first wafer pod and the second wafer pod, respectively,
   wherein respective ones of the first plurality of light emitters, the first plurality of light detectors and the first plurality of through holes are vertically aligned with one another, and
   respective ones of the second plurality of light emitters, the second plurality of light detectors and the second plurality of through holes are vertically aligned with one another; and
   a processor configured to determine based on the calibration data whether the first and second wafers are positioned at the first and second wafer positions, respectively.

2. The system of claim 1, wherein the processor is further configured to:
   determine whether at least one of the first and second wafers are not positioned at the first and second wafer positions, respectively, based on the calibration data; and
   send an instruction signal for a robotic arm to move at least one of the first and second wafers, respectively.

3. The system of claim 1, wherein the first and second light emitters are of an equal number on both sides of the axis of entry of the second wafer pod, and the first and second light detectors are of equal numbers on both sides of the axis of entry of the first wafer pod.

4. The system of claim 3, wherein:
   the first plurality of light emitters comprise five light emitters;
   the second plurality of light emitters comprise five light emitters;
   the first plurality of light detectors comprise five light detectors; and
   the second plurality of light detectors comprise five light detectors.

5. The system of claim 4, wherein the processor is configured to determine that at least one of the first and second wafers is at the first and second predetermined wafer positions, respectively, when only second and third closest light detectors to a rear wall of the first cavity, on both sides of the axis of entry, detect the wafer.

6. A system, comprising:
   a plurality of wafer pods stacked vertically with respect to each other, each wafer pod configured to receive a wafer;
   a plurality of light emitters disposed on a top surface of the topmost wafer pod, wherein a first plurality of the light emitters is arranged in a first line on a first side of an axis of entry of the topmost wafer pod that horizontally bisects a first cavity of the topmost wafer pod and a second plurality of the light emitters is arranged in a second line on a second side of the axis of entry of the second wafer pod;
   a plurality of light detectors disposed on a bottom surface of a bottommost wafer pod, wherein a first plurality of the light emitters is arranged in a first line on a first side of an axis of entry of the bottommost wafer pod that horizontally bisects a second cavity of the bottommost wafer pod, and a second plurality of the light detectors is arranged in a second line on a second side of the axis of entry of the bottommost wafer pod, wherein the plurality of light detectors are configured to produce calibration indicating whether respective wafers are positioned at predetermined respective wafer positions within each of the plurality of wafer pods, respectively;
   a plurality of through holes disposed on a top surface of the bottommost wafer pod and a bottom surface of the topmost wafer pod, wherein a first plurality of the through holes is arranged in the first line on the first side of the axis of entries of the topmost and bottommost wafer pods, respectively, and a second plurality of the through holes is arranged in the second line on the second side of the axis of entries of the topmost and bottommost wafer pods, respectively,
   wherein respective ones of the first plurality of light emitters, the first plurality of light detectors and the first plurality of through holes are vertically aligned with one another, and respective ones of the second plurality of light emitters, the second plurality of light detectors and the second plurality of through holes are vertically aligned with one another a processor configured to produce error data indicating how a respective wafer is offset from a respective wafer position within a respective one of the plurality of wafer pods based on the calibration data; and
   a robotic arm configured to move a respective wafer based on the error data.

7. The system of claim 6, wherein the error data indicates whether the robotic arm is to move the respective wafer in a particular direction.

8. The system of claim 6, wherein the processor is further configured to determine whether the respective wafer is at the respective wafer position within the respective wafer pod based on the calibration data.

9. The system of claim 6, wherein:
   the plurality of light emitters are arrayed with an equal number of light emitters on both sides of the axis of entry; and
   the plurality of light detectors are arrayed with an equal number of light detectors on both sides of the axis of entry.

10. The system of claim 9, wherein:
   the first plurality of light emitters comprise five light emitters;
   the second plurality of light emitters comprise five light emitters;
   the first plurality of light detectors comprise five light detectors; and
   the second plurality of light detectors comprise five light detectors.

11. The system of claim 10, wherein the processor is configured to determine that at least one of the first and second wafers is at the first and second predetermined wafer positions, respectively, when only second and third closest light detectors to a rear wall of the first cavity, on both sides of the axis of entry, detect the wafer.

12. A method, comprising:
   collecting calibration data cavity, wherein the calibration data is produced from calibration sensors, wherein a first plurality of the calibration sensors from a plurality of light detectors, wherein a first plurality of light detectors is arranged in a first line on a first side of an axis of entry that horizontally bisects a first cavity of a bottom wafer pod, and a second plurality of the light detectors is arranged in a second line on a second side of the axis of entry of the bottom wafer pod, wherein the plurality of light detectors are vertically aligned with a plurality of light emitters located on a top surface of a second cavity of a top wafer pod vertically stacked above the bottom wafer pod;
   producing error data indicating how the at least one wafer is offset from a predetermined wafer position within at least one of the first and second cavities; and
   moving the at least one wafer based on the error data.

13. The method of claim 12, further comprising:
   determining that the at least one wafer is at the predetermined wafer position within the first or second cavities based on the calibration data; and
   halting movement of a robotic arm based on the calibration data.

14. The method of claim 12, wherein the moving the wafer is performed via a robotic arm.

* * * * *